United States Patent
Chang et al.

(10) Patent No.: US 7,273,772 B2
(45) Date of Patent: Sep. 25, 2007

(54) METHOD FOR MANUFACTURING THIN FILM TRANSISTOR ARRAY PANEL

(75) Inventors: Won-Kie Chang, Seoul (KR); Jin-Wook Lee, Cheonan (KR); Won Song, Yongin (KR); Jeong-Sik Yoo, Cheonan (KR); You-Keun Kim, Cheonan (KR); Dong-Uk Choi, Suwon (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 99 days.

(21) Appl. No.: 10/867,811

(22) Filed: Jun. 16, 2004

(65) Prior Publication Data

US 2005/0019969 A1 Jan. 27, 2005

(30) Foreign Application Priority Data

Jun. 16, 2003 (KR) .................... 10-2003-0038713

(51) Int. Cl.
*H01L 21/00* (2006.01)

(52) U.S. Cl. ............. 438/149; 438/158; 438/DIG. 905; 257/E21.224; 257/E21.409

(58) Field of Classification Search ................ 438/149, 438/905, 800, 158; 257/E21.224, E21.409
See application file for complete search history.

(56) References Cited

U.S. PATENT DOCUMENTS

| | | | | |
|---|---|---|---|---|
| 669,300 | A * | 3/1901 | Beekman | 24/315 |
| 5,779,866 | A * | 7/1998 | Tarancon | 204/262 |
| 5,812,403 | A * | 9/1998 | Fong et al. | 700/121 |
| 6,043,511 | A * | 3/2000 | Kim | 257/59 |
| 6,207,480 | B1 * | 3/2001 | Cha et al. | 438/149 |
| 6,300,152 | B1 * | 10/2001 | Kim | 438/30 |
| 6,387,288 | B1 * | 5/2002 | Bjorkman et al. | 216/67 |
| 6,624,051 | B1 * | 9/2003 | Ohtani et al. | 438/486 |
| 6,682,961 | B1 * | 1/2004 | Kim | 438/149 |
| 6,758,224 | B2 * | 7/2004 | Nogami | 134/22.1 |
| 6,790,716 | B2 * | 9/2004 | Cha et al. | 438/155 |
| 6,843,258 | B2 * | 1/2005 | Shang et al. | 134/22.1 |
| 6,875,674 | B2 * | 4/2005 | Asami et al. | 438/482 |
| 6,880,561 | B2 * | 4/2005 | Goto et al. | 134/22.1 |
| 6,881,276 | B2 * | 4/2005 | Blonigan et al. | 134/18 |
| 6,886,573 | B2 * | 5/2005 | Hobbs et al. | 134/22.1 |
| 6,905,917 | B2 * | 6/2005 | Song et al. | 438/149 |
| 2003/0001159 | A1 * | 1/2003 | Ohtani et al. | 257/64 |
| 2003/0010354 | A1 * | 1/2003 | Goto et al. | 134/1.1 |
| 2004/0002180 | A1 * | 1/2004 | Kim et al. | 438/73 |
| 2004/0037768 | A1 * | 2/2004 | Jackson | 423/500 |

* cited by examiner

*Primary Examiner*—Scott B. Geyer
*Assistant Examiner*—Stanetta Isaac
(74) *Attorney, Agent, or Firm*—F. Chau & Associates, LLC

(57) ABSTRACT

The present invention relates to a method of manufacturing a thin film transistor array panel and apparatus and more particularly to an apparatus containing an in-situ fluorine generation chamber.

11 Claims, 15 Drawing Sheets

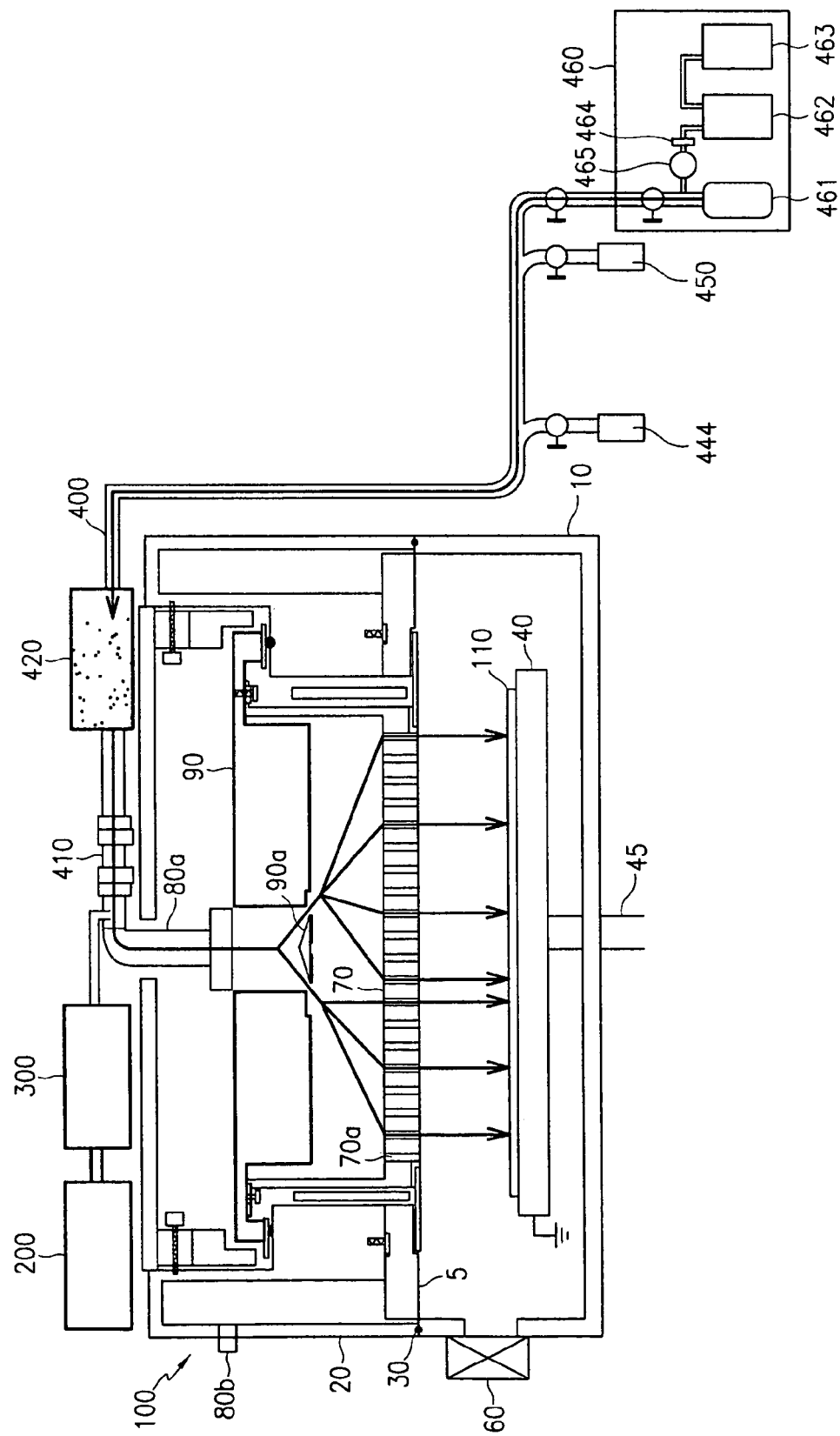

METHOD FOR MANUFACTURING THIN FILM TRANSISTOR ARRAY PANEL

This application claims the benefit of Korean Patent Application No. 2003-0038713, filed on Jun. 16, 2003, which is hereby incorporated by reference for all purposes as if fully set forth herein.

BACKGROUND OF THE INVENTION

1. Field of the Invention

The present invention relates to a method for manufacturing a thin film transistor array panel and apparatus and more particularly to an apparatus containing an in-situ fluorine generation chamber.

2. Description of Related Art

A thin film transistor ("TFT") array panel may be used for individually driving each pixel of a display. The display may be a liquid crystal display ("LCD"), organic electro luminescence ("EL") display, and the like. The TFT array panel includes scanning signal lines or gate lines for transmitting scanning signals. Also, the TFT array panel includes image signal lines or data lines formed on the TFT array for transmitting image signals. Further, the TFT array panel includes TFTs connected to gate lines, data lines and pixel electrodes.

A gate insulating layer is formed in order to insulate the gate lines. A passivation layer is formed to insulate the TFTs and the data lines. The gate insulating layer, semiconductor layer, ohmic contact layer, and passivation layer are formed using a chemical vapor deposition ("CVD") process that may be well known in the art.

In the related art, films or layers are formed with chemical reactions using a CVD process. That is, by providing one or more gases (e.g., simple or compound substance(s) including element(s)) films and/or layers may be formed on a substrate. During the CVD deposition processes on the insulating substrate extraneous films and/or layers are formed on the CVD. The present invention also discloses a more environmentally friendly process chamber and/or on the surface of a diffuser. These extraneous films and/or layers create differences in thermal expansion coefficients between the diffuser and the films deposited thereon. These differences create thermal stresses in the deposited films. As a result, the deposited film deteriorates and may peel off, generating undesired minute particles. Accordingly, a cleaning process is used to remove the extraneous film deposits on inner walls of the chamber and/or on the surface of the diffuser. For example, a nitrogen trifluoride ($NF_3$) plasma etching process may be performed as a way to clean the CVD chamber.

A remote plasma source ("RPS") box may be used for forming nitrogen trifluoride ($NF_3$) plasma. The RPS box may be placed in gas piping. The RPS box generates nitrogen trifluoride ($NF_3$) and argon (Ar) plasmas and transmits these plasmas into the CVD chamber. These plasmas remove the accumulated films formed inside the chamber during deposition and restore the chamber to its initial state.

The related art processes required a stable supply of nitrogen trifluoride ($NF_3$). Nitrogen trifluoride ($NF_3$) is typically purchased in a cylinders that need to be replaced regularly. However, a stable supply of nitrogen trifluoride ($NF_3$) may not be possible as it is dependent on its availability from the supplier. Additionally, nitrogen trifluoride ($NF_3$) systems are very expensive as there is a very high initial investment cost. Moreover, nitrogen trifluoride ($NF_3$) is an environmentally unfriendly gas as it is categorized as a PFC restriction gas.

SUMMARY OF THE INVENTION

Accordingly, the present invention is directed a method for manufacturing a TFT array panel that substantially obviates one or more of the problems mentioned above.

The present invention discloses a stable supply of fluorine gas for fluorine plasma formation, achieving cost reduction in manufacturing an TFT apparatus. The present invention also discloses an environmentally friendly process and provides a cleaning method for a CVD apparatus in order to produce improved TFT arrays.

Additional features of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, A method of forming a thin film transistor (TFT) array panel, comprising providing a substrate. Forming a plurality of gate lines on the insulating substrate. Successively forming a gate insulating layer on the plurality of gate lines, a semiconductor layer on the gate insulating layer, and an ohmic contact layer on the semiconductor layer in a first chemical vapor deposition (CVD) apparatus. Cleaning the first CVD apparatus with a fluorine plasma after a predetermined number of the successively forming steps has been preformed on different substrates.

In another aspect of the present invention, a method of forming thin film transistor (TFT) array panel, comprising providing an insulating substrate into a first CVD apparatus. Forming a plurality of gate lines on the insulating substrate. Successively forming a gate insulating layer on the plurality of gate lines, a semiconductor layer on the gate insulating layer, and an ohmic contact layer on the semiconductor layer in a first chemical vapor deposition (CVD) apparatus, wherein the first CVD apparatus is cleaned prior to successively forming with a first fluorine plasma generated in a RPS box. Forming a plurality of data lines. Forming a passivation layer over the plurality of data lines and forming contact holes into the passivation layer in a second CVD apparatus, wherein the second CVD apparatus is cleaned with a second fluorine plasma prior forming the passivation layer. Forming pixel electrodes on the passivation layer and electrically connected to the second conductive layer.

In another aspect of the present invention, a thin film transistor (TFT) array panel, comprising an insulating substrate, a first adhesion material formed on the insulating substrate. A first conductive material formed on the first adhesion material, wherein the first adhesion material and the first conductive material form gate lines and a gate insulating layer formed on the first conductive material. A source and drain region formed from a second adhesion material, a second conductive material, and an ohmic contact. A passivation layer formed over the second conductive material and a pixel electrode connected to a drain region.

In another aspect of the present invention, a chemical vapor deposition (CVD) apparatus, comprising a deposition chamber. A gas pipe having a first end connected to the deposition chamber and a second end opposite the first end and a fluorine supplier connected to the second end to generate fluorine gas. A RPS box arranged in the CVD apparatus to form plasma from fluorine gas received from the gas pipe and a backing plate to support a diffuser arranged in the deposition chamber. A diffusion plate to diffuse reaction gas into injection holes arranged in the diffuser. A susceptor that receives a substrate and a susceptor carrier that adjusts the position of the susceptor.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are incorporated in and constitute a part of the specification, illustrate embodiments of the invention and together with the general description and the detailed description given serve to explain the invention.

FIG. 10 illustrates a second CVD apparatus used in a method for manufacturing a TFT array panel according to an embodiment of the present invention, which shows the flow of gas in an internal cleaning process of the first CVD apparatus using fluorine ($F_2$) plasma etching.

DETAILED DESCRIPTION OF THE ILLUSTRATED EMBODIMENTS

Reference will now be made in detail to embodiments of the present invention, examples of which are illustrated in the accompanying drawings.

Figure 1A:
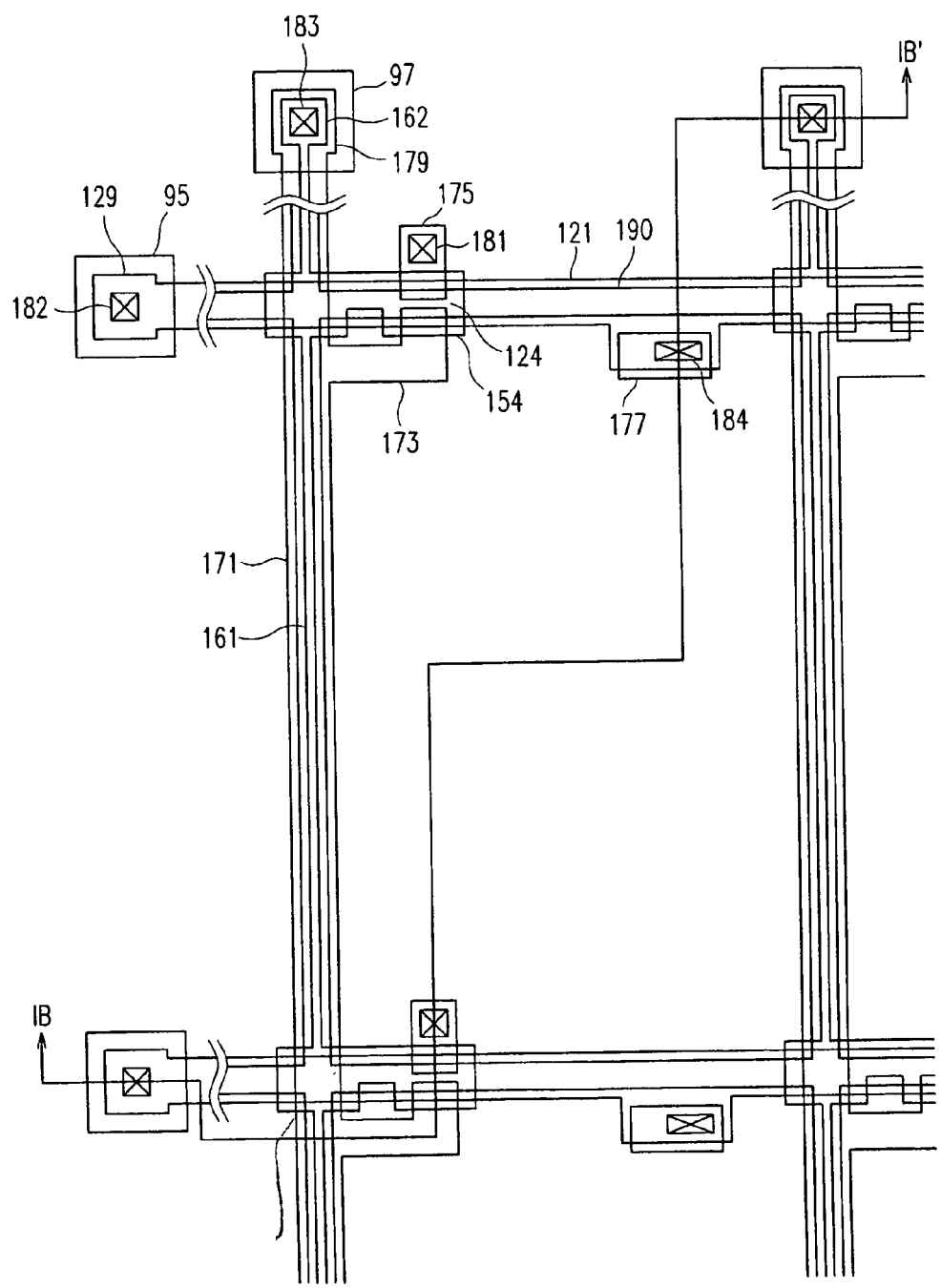
FIG. 1A illustrates a TFT array panel manufactured by a method according to an embodiment of the present invention.
Figure 1B:
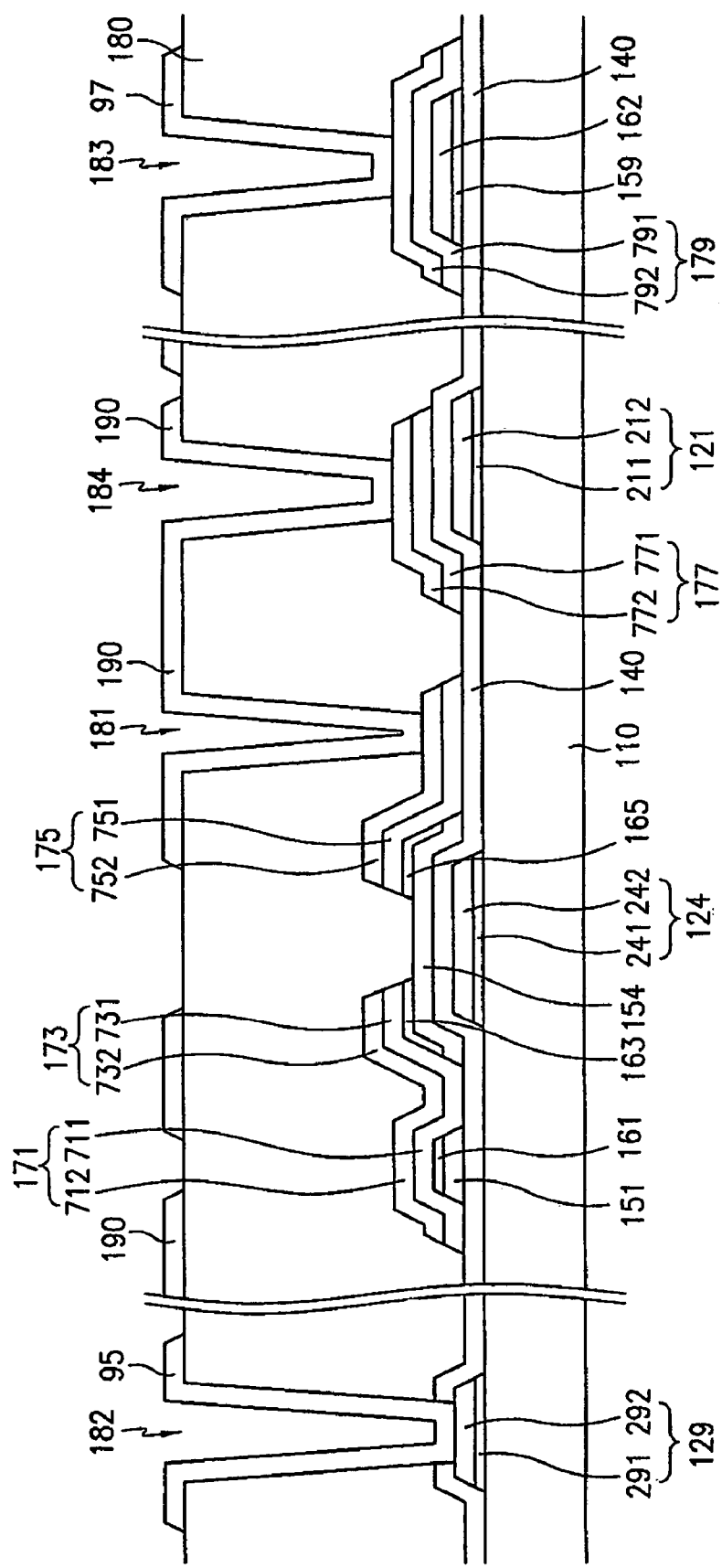
FIG. 1B illustrates a TFT array panel of FIG. 1A taken along the line IB-IB'.

FIG. 1A illustrates a layout view showing a TFT array panel manufactured by a method according to an embodiment of the present invention. FIG. 1B illustrates a sectional view of the TFT array panel of FIG. 1A taken along the line IB-IB'. Referring to FIGS. 1A and 1B, a plurality of gate lines 121, 124, and 129 are formed on a transparent insulating substrate 110. Each gate line has a double-layered structure including a first adhesive metal pattern 211, 241, and 291 and a first wire metal pattern 212, 242, and 292. The first adhesive metal pattern 211, 241 and 291 provides for better adhesion between the first wire metal pattern 212, 242, and 292 and the insulating substrate 110.

The gate line 121 extends in a substantially transverse direction and a portion of each gate line 121 serves as gate electrode 124. A portion 129 near one end of each gate line 121 is a gate pad. It may be wider than the other portions of the gate line .121 and used for connection to an external circuit. A gate insulating layer 140 may cover the entire substrate including the gate lines 121, 124, and 129.

A plurality of semiconductor patterns 151, 154, and 159 made of a semiconductor material are formed. For example, an amorphous silicon layer may be formed on the gate insulating layer 140 opposite the gate electrodes 124. A plurality of ohmic contact patterns 161, 163, and 165 made of a semiconductor material are formed. For example, amorphous silicon which may be heavily doped with an n-type impurity may be formed on semiconductor patterns 151, 154, and 159. Additionally, a plurality of data lines 171, 173, 175, 177, and 179 may be formed on the ohmic contact patterns 161, 163, and 165 and the gate insulating layer 140.

Data lines 171 intersect the gate lines 121 and are formed to be substantially perpendicular to each other. The area between the intersection of these lines define pixel areas. A portion of each data line 171 may serve as a source electrode 173 and may be connected to the ohmic contact pattern 163. The drain electrodes 175 are separated from the source electrodes 173 and are located opposite the source electrodes 173. That is, the drain electrode is located on portion 165 of the respective pairs of the ohmic contact patterns 163 and 165 with respect to the corresponding gate electrodes 124. A portion 179 near one end of each data line 171 is a data pad. It may be wider than the other portions of the data line and is used for connection to an external circuit. A plurality of storage electrodes 177 may be overlapped with the gate lines 121 and may be formed to increase storage capacitance.

Each of the data lines 171, 173, 175, and 179 and the storage electrodes 177 may be formed in multiple-layered structure. For example, these multiple-layered structures may include a second adhesive metal pattern 711, 731, 751, and 791 and a second wire metal pattern 712, 732, 752, and 792. The second adhesive metal patterns 711, 731, 751, and 791 provide for better adhesion between the second wire metal pattern 712, 732, 752, and 792 and the ohmic contact patterns 161, 163, and 162.

A passivation layer 180 may be formed on the substrate. The passivation layer 180 may include a plurality of first contact holes 181 exposing the drain electrodes 175, a plurality of second contact holes 182 exposing the end portions 129 of the gate lines, a plurality of third contact holes 183 exposing the end portions 179 of the data lines, and a plurality of fourth contact holes exposing the storage electrodes 177.

A plurality of pixel electrodes 190 may be connected to the drain electrodes 175 and the storage electrodes 177 via the first contact hole 181 and the fourth contact hole 184, respectively. A plurality of gate contacts 95 may be connected to the end portions 129 of the gate lines via the second contact holes 182. A plurality of data contacts 97 may be connected to the end portions 179 of the data lines via the third contact holes 183. The pixel electrodes 190 may be formed to overlap the gate lines 121 and the data lines 171, thereby partly increasing an aspect ratio. Alternatively, they may be formed not to overlap the gate line and the data line. Signal interference between the pixel electrode 190 and the data line 171 can be decreased by using a passivation layer 180 having a low dielectric constant. Accordingly, the pixel electrodes 190 may be formed to overlap with the data line 171.

Now a method of manufacturing a TFT array panel according to an embodiment of the present invention will be described in detail with reference to the drawings.

Figure 2A:
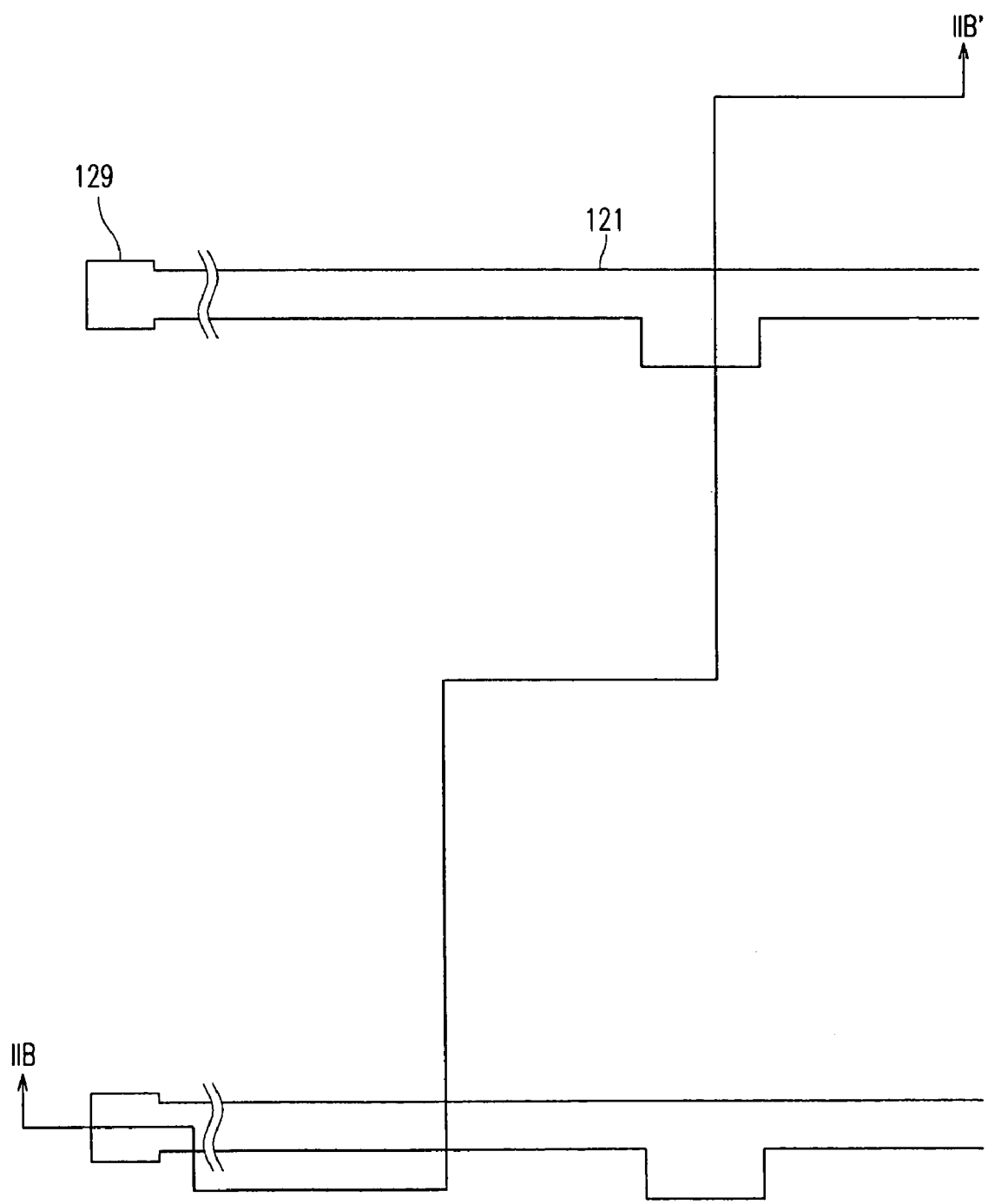
FIGS. 2A, 2B, 3, 6A, 6B, 7A, 7B, 8A, and 8B illustrate methods for manufacturing a TFT array panel according to an embodiment of the present invention.
Figure 2B:
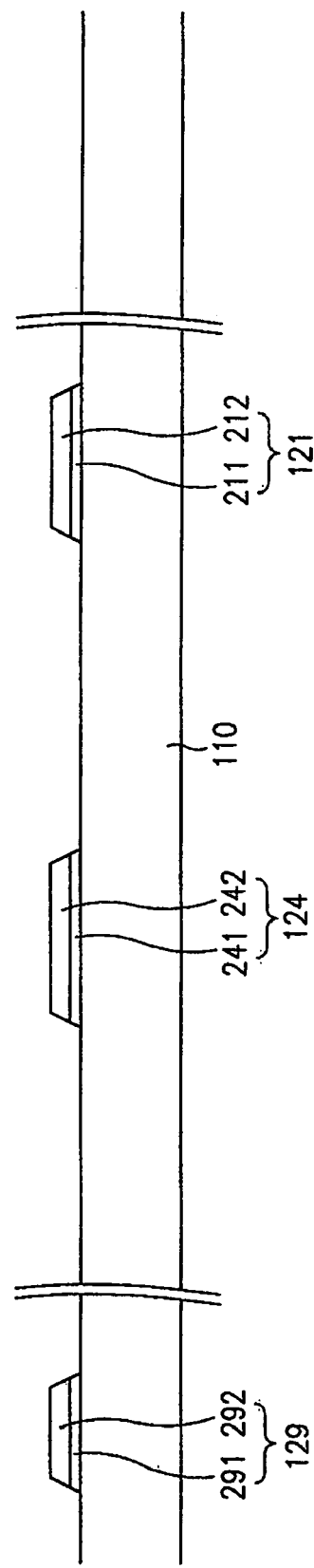

Referring to FIGS. 2A and 2B, a first adhesive layer and a first wire layer are sequentially deposited on a transparent insulating substrate 110. The deposited layers are patterned using photolithography to form a plurality of gate lines 121, 124, and 129 including first adhesive metal patterns 211, 241, and 291 and first wire metal patterns 212, 242, and 292. The two layers may be simultaneously wet etched during the photolithography step using an acid mixture containing, for example, acetic acid, phosphoric acid, and/or nitric acid mixed at predetermined ratios.

The first adhesive layer may be made of a metal having good contact characteristics in order to form silicides with the transparent insulating substrate 110. For example, the metal may be cobalt, cobalt alloy, nickel, nickel alloy, or the like.

The first wire layer may be made of a metal having good conductivity. For example, the first wire layer may be made of copper. This is a suitable even though the contact characteristics with the substrate are not very good. Additionally, the lateral surfaces of the gate line 121 may be inclined at an angle ranging from about 30° to about 80° measured from a horizontal plane.

Figure 3:
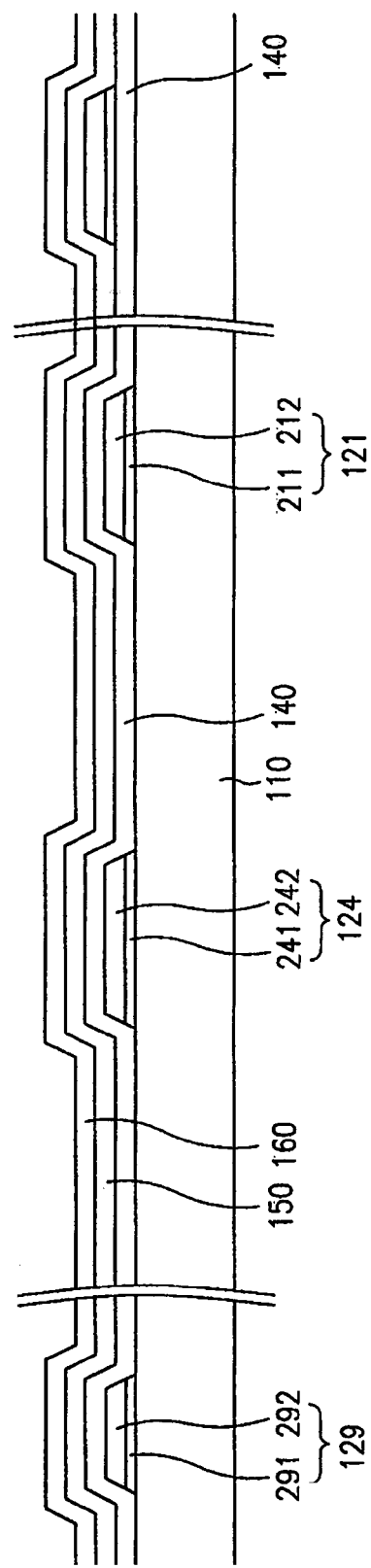

Referring to FIG. 3, a gate insulating layer 140 may be formed on the substrate and over the gate lines 121, 124, and 129. The gate insulating layer 140 may be silicon nitride or silicon oxide. A semiconductor layer 150 may be formed over the gate insulating layer 140 and the semiconductor layer is not doped with impurities. An ohmic contact layer 160, which may be highly doped with n-type impurities, is formed on the gate insulating layer 140. The semiconductor material may be amorphous silicon.

The gate insulating layer 140, the semiconductor layer 150, and the ohmic contact layer 160 are formed with a first CVD apparatus. The gate insulating layer 140, the semiconductor layer 150, and the ohmic contact layer 160 are successively formed.

The successive process will be described in detail with reference to the drawings as follows. The insulating substrate 110 on which the gate lines 121 are formed is brought into the first CVD apparatus. Next, the gate insulating layer 140, the semiconductor layer 150, and the ohmic contact layer 160 are successively formed on the insulating substrate 110.

Figure 4:
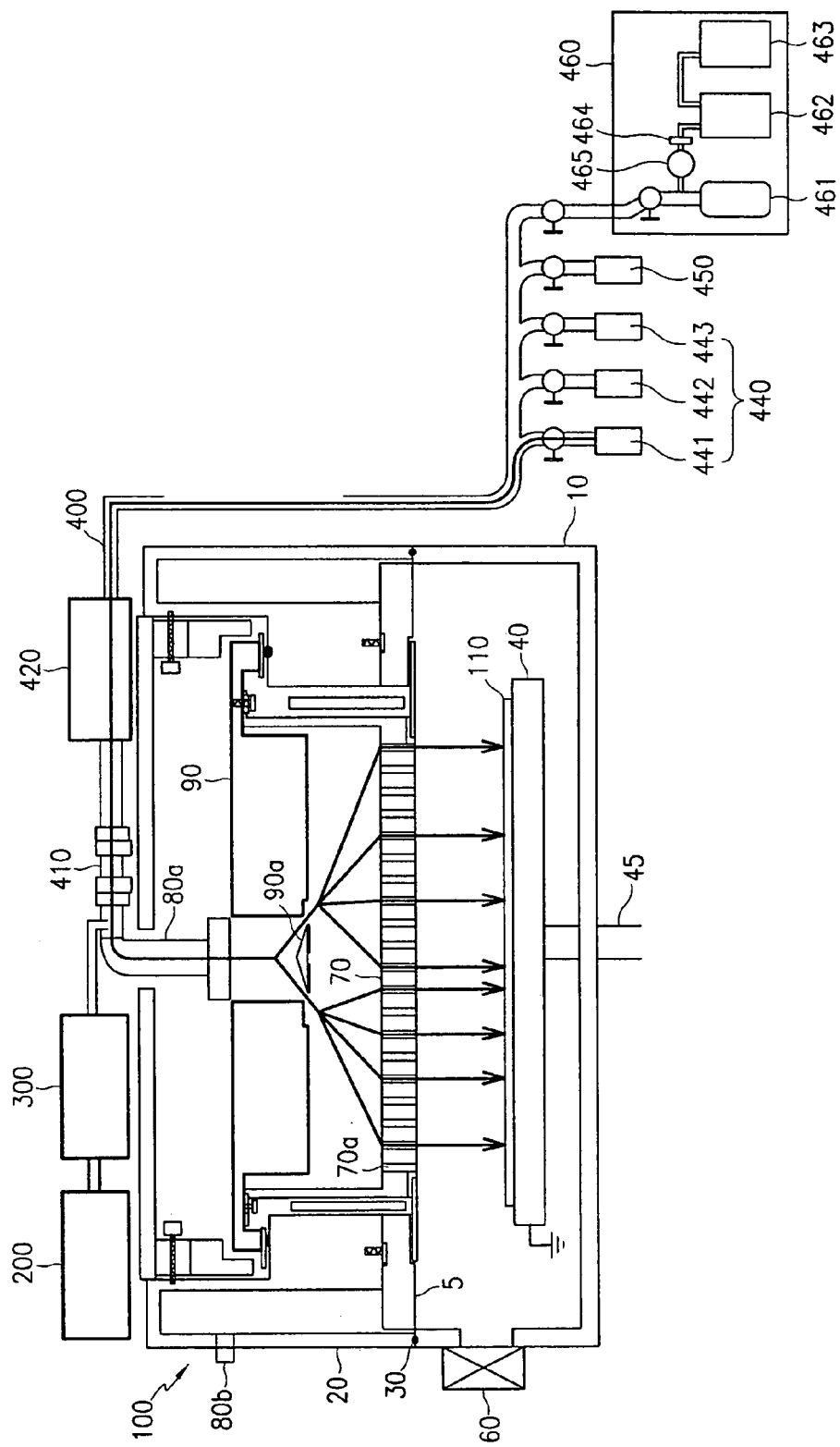
FIG. 4 illustrates a first CVD apparatus used in a method for manufacturing a TFT array panel according to an embodiment of the present invention, which shows the flow of reaction gas in the CVD process.

FIG. 4 illustrates a schematic diagram of the first CVD apparatus. Referring to FIG. 4, the first CVD apparatus includes a chamber 100. The chamber 100 is a reaction room in which a film is deposited using reaction gas and is isolated from outside. The chamber 100 includes a lower part 10 and a lid 20. An O-ring 30 may be placed on a joint portion between the lid 20 and the lower part 10 in order to effectively isolate the reaction room from the outside.

A slot valve 60 may be arranged along a sidewall on the lower part 10 of the chamber 100. The slot valve 60 may be opened in order to transport the insulating substrate 110 into the lower part 10 from a load lock part. A susceptor 40 may be arranged inside the chamber lower part 10. The insulating substrate 110 is arranged on the susceptor 40. The susceptor 40 may be moved up and down by a susceptor carrier 45. Optionally, a heater is arranged in the susceptor 40 for heating the insulating substrate 110.

A gas injecting pipe 80*a* may be arranged on a joint portion of the gas piping 400 for injecting gas into the chamber 100. A backing plate 90 may be arranged in front of the gas injection pipe 80*a* for supporting a diffuser 70. The backing plate 90 may be made of a conductive material in order to serve as a transfer metal for transferring RF power to the diffuser. In operation, reaction gas is injected through the gas injection pipe 80*a* and strikes the diffusion plate 90*a* formed in the backing plate 90, thereby flowing around the diffusion plate 90*a* and dispersing near the diffuser 70.

The diffuser 70 is arranged under the backing plate 90 and separated from the backing plate 90 by a predetermined distance. The diffuser 70 allows the reaction gas to be substantially uniformly dispersed above the insulating substrate 110 and also may simultaneously serve as a plasma electrode. A plurality of injection holes 70*a* may be formed on one a side of the diffuser 70 opposing the insulating substrate 110. The gas is provided to the diffuser 70 via the gas injection pipe 80*a* and may be uniformly dispersed over an entire surface of the insulating substrate 110 through the injection holes 70*a*. The dispersed gas may be vented or exhausted via a gas exhaust pipe 80*b*.

The diffuser 70 may be connected to an RF power generator 200 in this configuration the diffuser may serve as a plasma electrode and the susceptor 40 may be grounded. Power generated from the RF power generator 200 is tuned by a RF matcher 300 and transmitted to the backing plate 90 via the gas injection pipe 80*a*. RF power is transferred to the diffuser 70 connected to the backing plate 90.

Since the diffuser may serve as a plasma electrode, it should be made of a conductive material, for example, the diffuser may be made of aluminum. To protect the surface of the diffuser, the surface of the diffuser may be anodized as an oxide. A piping insulator 410 may be placed between the gas piping 400 and the gas injection pipe 80*a* in order to prevent power from being transferred to the gas piping 400.

An RPS box 420 and the piping insulator 410 may be arranged in sequence on the gas piping 400, thereby creating a pathway for injecting gas into the chamber lower part 10. A reaction gas box 440 may be filled with reaction gases. A nitrogen ($N_2$) gas box 450 is connected to the chamber lower part 10 to create atmospheric pressure in the chamber. A fluorine ($F_2$) supplier 460 is connected to an end portion of the gas piping 400 and used for generating an etching plasma. Additionally, the reaction gas box 440 may include a gate insulating layer formation box 441, a semiconductor layer formation box 442, and an ohmic contact layer formation box 443.

FIG. 4 also shows a flow of reaction gas during a CVD deposition process, more specifically, a flow of reaction gas during the deposition process of the gate insulating layer. During this process reaction gas in the gate insulating layer formation box 441 is injected into the lower part 10. This is accomplished by passing gas through the gas injection pipe 80*a*, the backing plate 90, and the diffuser 70 via the gas piping 400 in order to form the gate insulating layer 140. During this process the RPS box 420 serves as a piping pathway.

After the gate insulating layer 140 is formed, the gate insulating layer formation box 441 is closed and the semiconductor layer formation box 442 is open. Accordingly, reaction gas in the semiconductor layer formation box 442 is injected into the lower part 10 via the gas piping 400, thereby forming the semiconductor layer 150.

After the semiconductor layer 150 is formed on the gate insulating layer 140, the semiconductor layer formation box 442 is closed and the ohmic contact layer formation box 443 is open. Accordingly, reaction gas in the ohmic contact layer formation box 443 is injected into the chamber lower part 10 via the gas piping 400 in order to form the ohmic contact layer 160. After performing the foregoing processes the insulating substrate is transported to the next fabrication apparatus that may conduct different processes.

These processes may be repeated on multiple insulating substrates that may have gate lines 121 formed thereon prior to the processes. The successive processes may be performed from about 6 to about 9 times in the first CVD apparatus before cleaning. After about 6 to about 9 successive processes, the first CVD apparatus is cleaned with fluorine ($F_2$). Optionally, the inside of the first CVD apparatus may be cleaned with fluorine ($F_2$) before forming the gate insulating layer 140, the semiconductor layer 150, and the ohmic contact layer 160.

The layers, for example, the gate insulating layer 140, the semiconductor layer 150, and/or the ohmic contact layer 160, are deposited not only on the insulating substrate 110 but also on the surface of a diffuser 70, thereby creating differences in thermal expansion coefficients between the diffuser 70 and the films deposited thereon. As a result, thermal stresses along the deposited films cause these films to become deteriorated, peel and/or flake off, and generate undesired minute particles. Accordingly, after a predetermined number of cycles, films on the inner walls of the chamber lower part 10 or the surface of the diffuser 70 may be etched by generating a fluorine ($F_2$) plasma from the RPS box 420 arranged on the gas piping 400.

Figure 5:
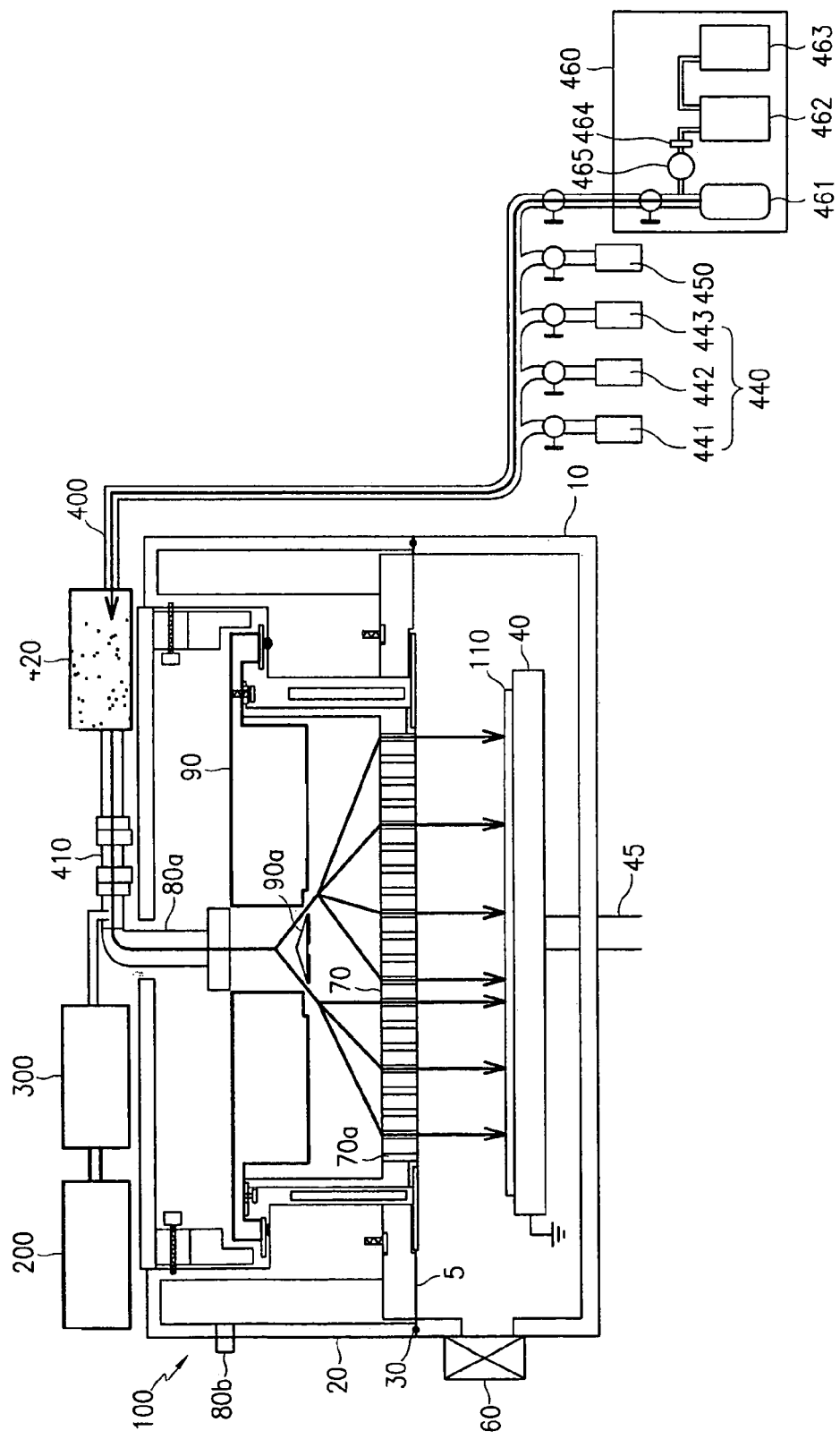
FIG. 5 illustrates a first CVD apparatus used in a method for manufacturing a TFT array panel according to an embodiment of the present invention, which shows the flow of gas in an internal cleaning process of the first CVD apparatus using fluorine ($F_2$) plasma etching.

FIG. 5 shows the gas flow during a cleaning process of the first CVD apparatus using fluorine ($F_2$) plasma etching. Referring to FIG. 5, the fluorine ($F_2$) supplier 460 includes a fluorine ($F_2$) cylinder 461 for storing fluorine ($F_2$) and a fluorine ($F_2$) generator 462 for generating fluorine ($F_2$) by electrolysis. Additionally, the supplier 460 includes a hydrofluoric (HF) acid box 463 for supplying (HF) to a fluorine ($F_2$) generator 462.

The fluorine ($F_2$) generator 462 generates fluorine ($F_2$) gas via electrolysis using hydrofluoric acid (HF) provided from the hydrofluoric acid (HF) box 463. Hydrogen ($H_2$) and other impurities are generated during hydrofluoric acid (HF) electrolysis and are removed using a filter 464 placed between the fluorine ($F_2$) generator and the fluorine ($F_2$) cylinder 461. Pure fluorine ($F_2$) gas is passed through the filter 464 and is compressed by a compressor 465 and provided to the fluorine ($F_2$) cylinder 461. The compressor 465 is used to supply fluorine ($F_2$) gas to the CVD apparatus at a constant pressure.

As shown in FIG. 5, during the cleaning of the first CVD apparatus, the reaction gas box 440 is closed while the fluorine ($F_2$) supplier 460 is opened. In this configuration, the RPS box 420 performs an operation for forming plasma using fluorine ($F_2$) gas injected from the fluorine ($F_2$) supplier 460. Fluorine ($F_2$) plasma generated in the RPS box 420 is injected into the chamber lower part 10 in order to remove the film(s) deposited on the inner walls of the chamber lower part 10 and/or the surface of the diffuser 70, thereby cleaning the CVD apparatus.

Figure 6A:
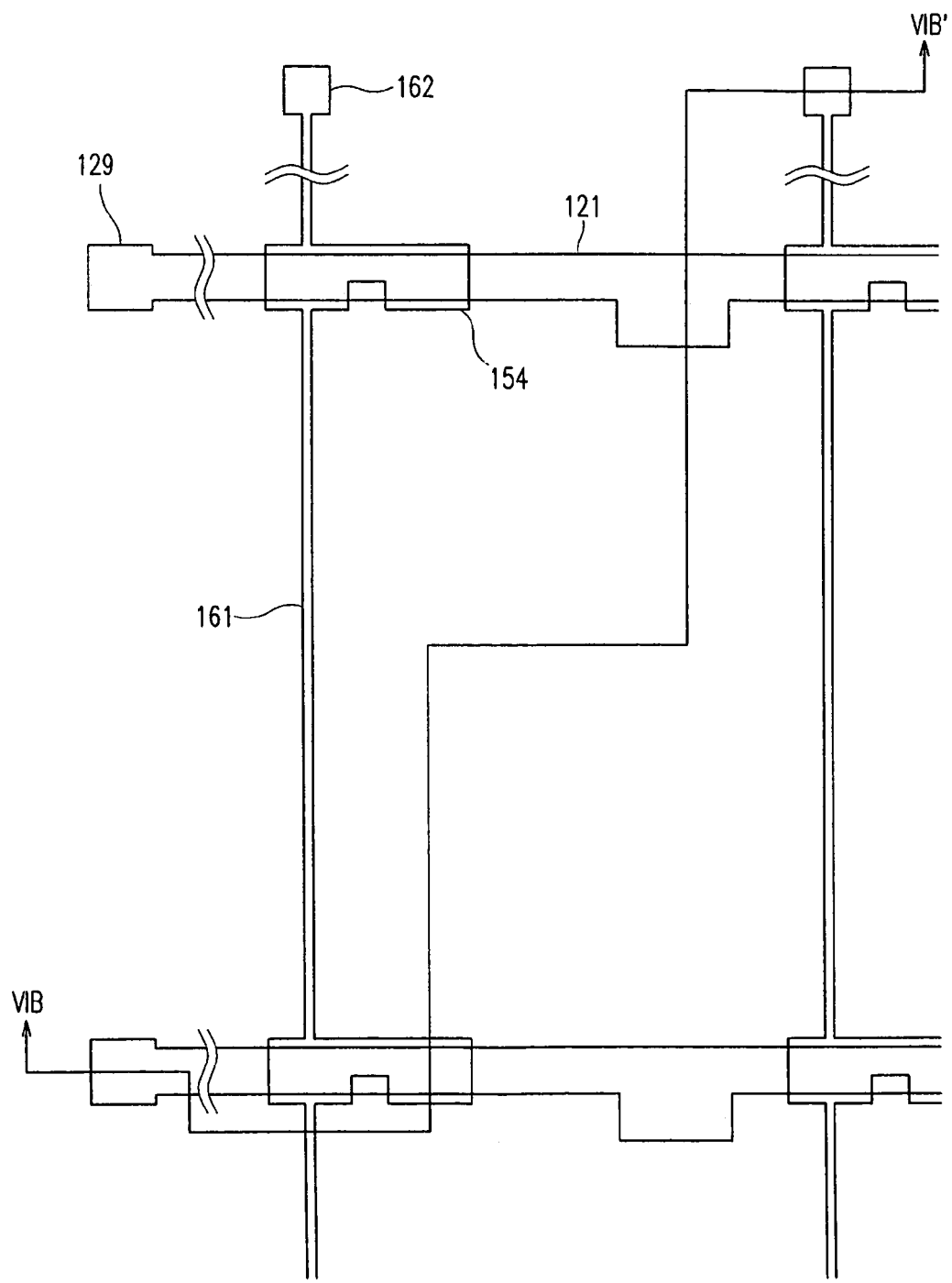
Figure 6B:
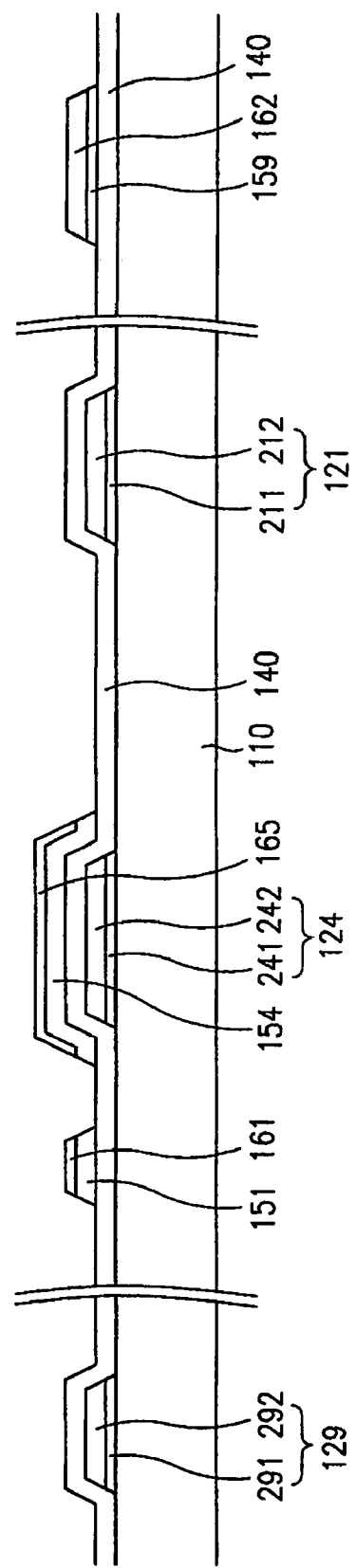

Referring to FIGS. 6A and 6B, the semiconductor layer 150 and the ohmic contact layer 160 may be etched using photolithography for creating the semiconductor patterns 151 and 154 and the ohmic contact patterns 161 and 165 directly on the gate insulating layer 140.

Figure 7A:
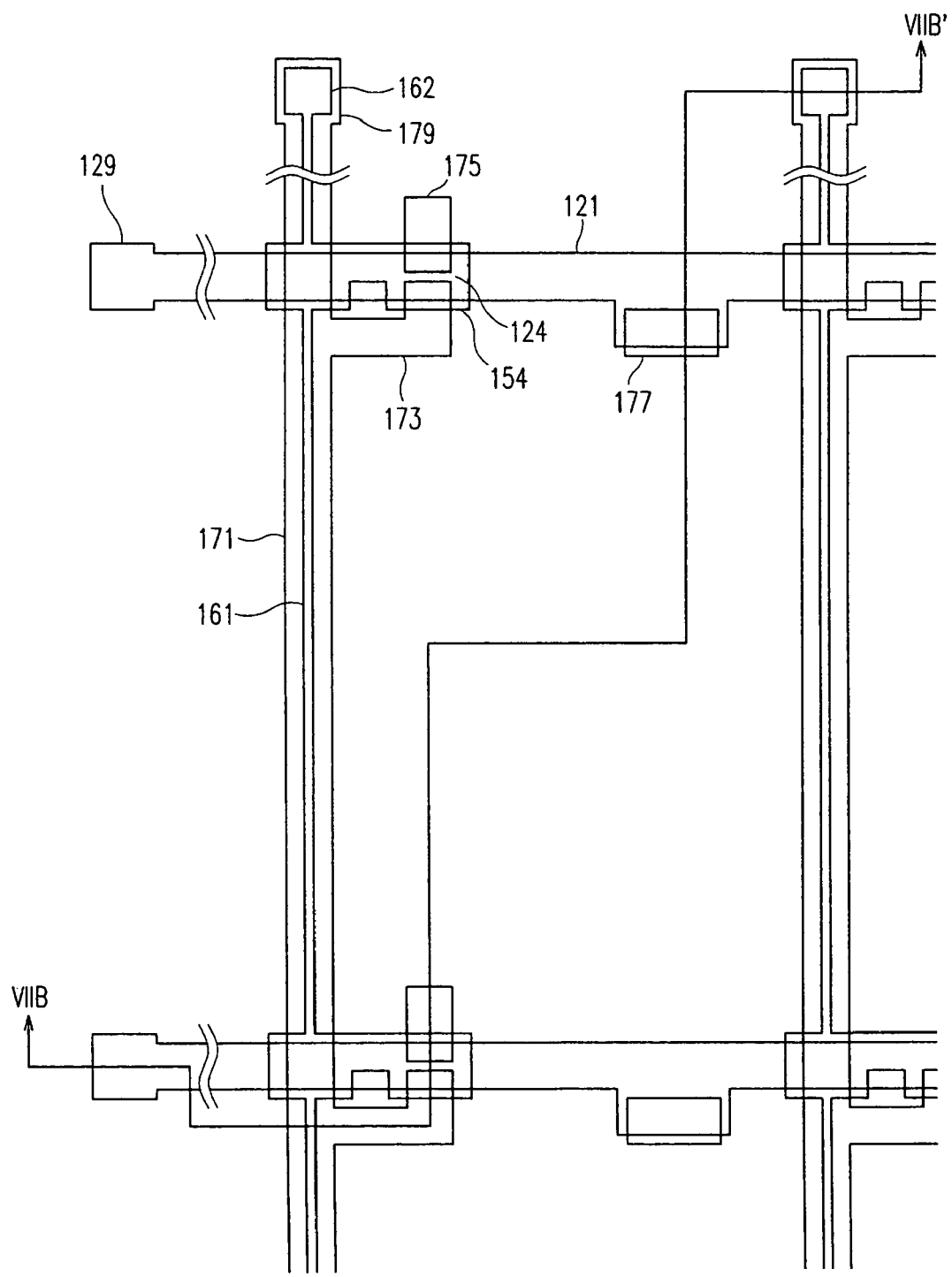
Figure 7B:
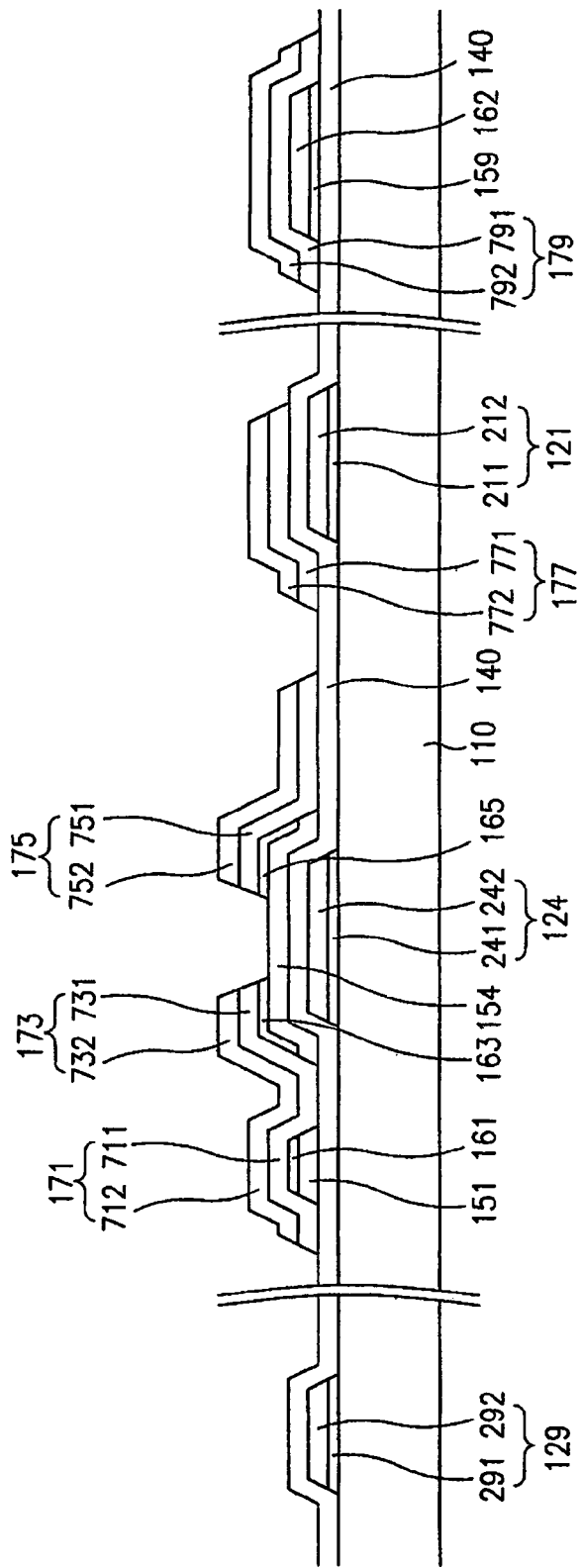

Referring to FIGS. 7A and 7B, the second adhesive layer and the second wire layer are formed on the substrate including the ohmic contact patterns 160 and 161. These layers are patterned via photolithography to form the data lines 171, 173, 175, and 179 and the storage electrodes 177, forming a multi-layered structure with the second adhesive metal patterns 711, 731, 751, and 791 and the second wire metal patterns 712, 732, 752, and 792. This process is the same as the process for forming the first adhesive metal patterns and wire metal patterns.

The semiconductor layer is formed between the source electrode 173 and the drain electrode 175. The channel portion 154 is formed by not overlapping a portion of the source electrode 173 with the semiconductor layer. The channel portion 154 is completed by forming the source electrode 173 and the drain electrode 175 and etching to remove the ohmic contact layer 160. The source electrode 173 and the drain electrodes 173 and 175 are used as an etching mask during this process. Accordingly, the ohmic contact layer is divided into a source portion and a drain portion. Simultaneously, an upper portion of the channel portion 154 may be partially etched.

Figure 8A:
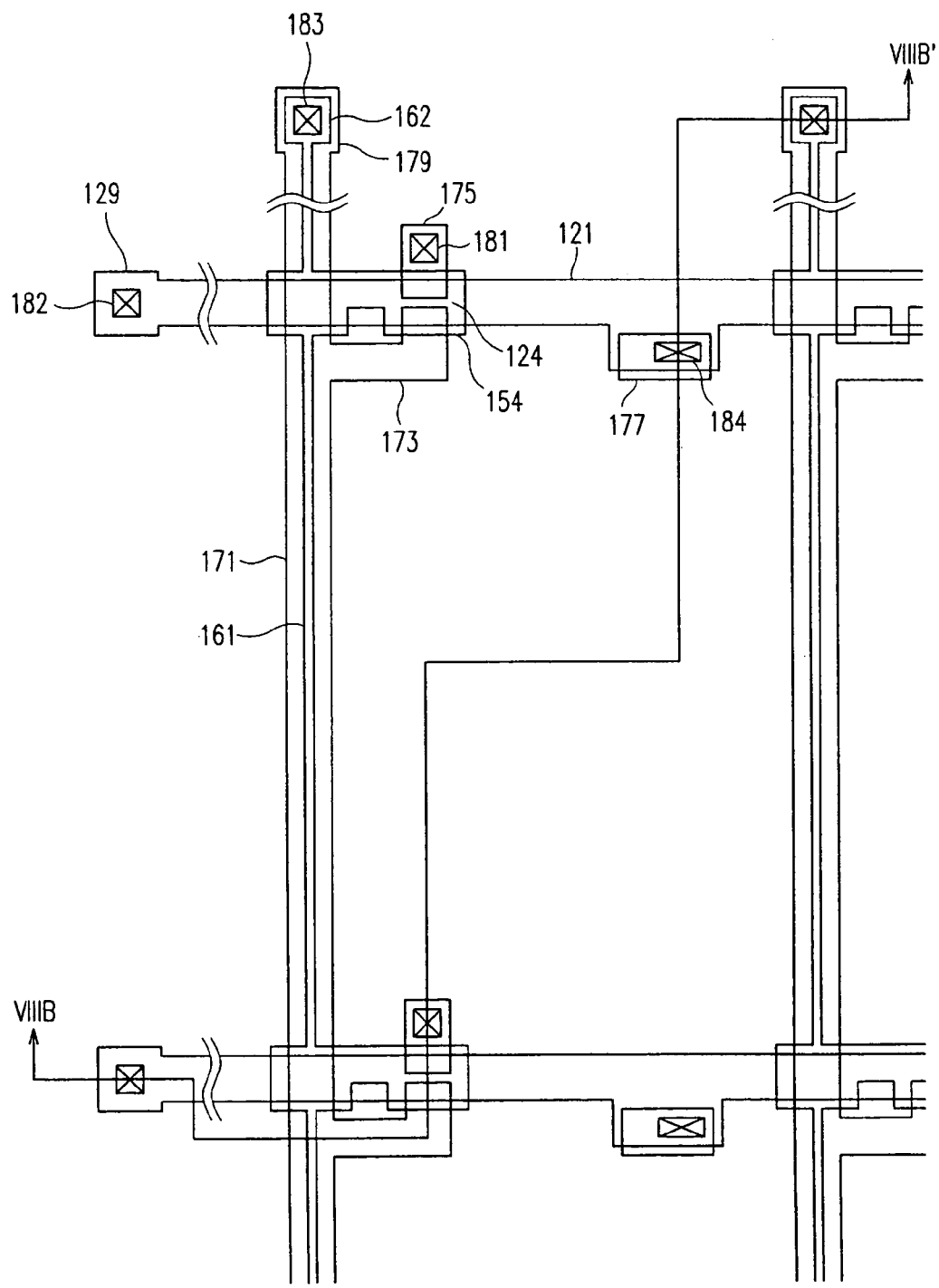
Figure 8B:
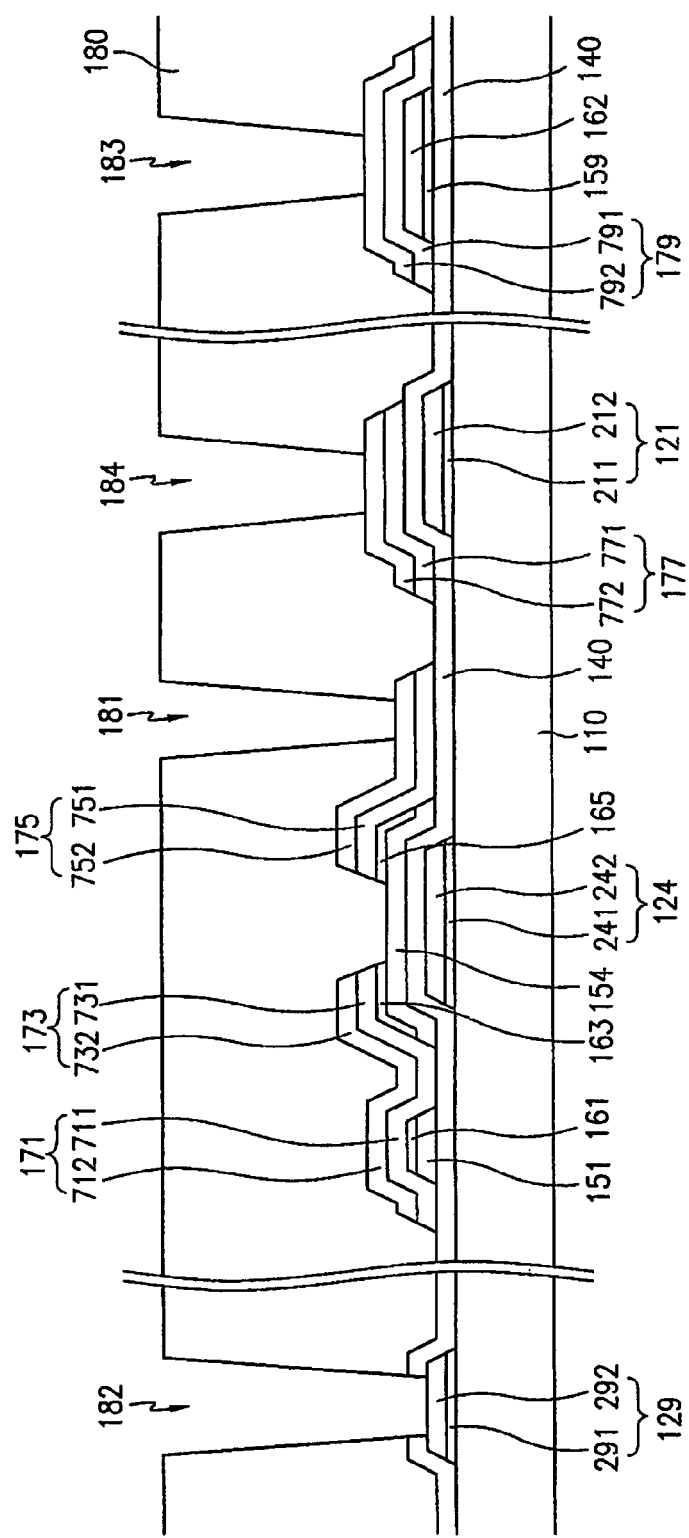

Referring to FIGS. 8A and 8B, an insulating material is applied to the entire surface of the substrate covering the data lines 171, 173, 175, and 179 and the storage electrodes 177, thereby forming passivation layer 180. Forming the passivation layer, a first contact hole 181, a second contact hole 182, a third contact hole 183 and the fourth contact hole 184 are formed by photolithography in the passivation layer 180.

The passivation layer 180 is formed with the second CVD apparatus. The formation process of the passivation layer 180 in the second CVD apparatus will now be described in detail with reference to the drawings.

Figure 9:
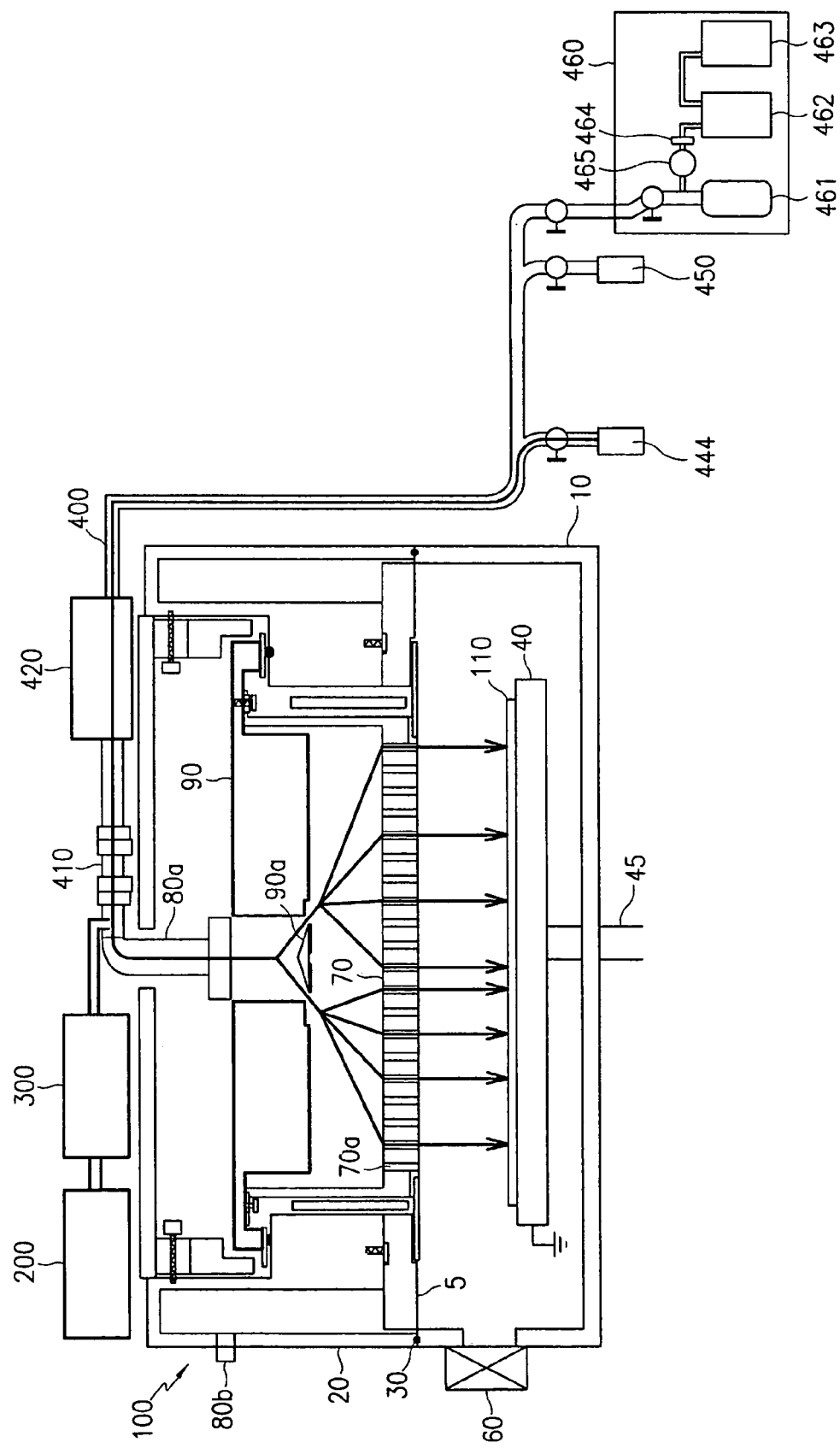
FIG. 9 illustrates a second CVD apparatus used in a method for manufacturing a TFT array panel according to an embodiment of the present invention, which shows the flow of reaction gas in the CVD process.

FIG. 9 illustrates a flow of reaction gas during CVD process for forming the passivation layer 180. Referring to FIG. 9, the second CVD apparatus is substantially similar to the first CVD apparatus except that the reaction gas box 440 of the first CVD apparatus is replaced with a passivation layer formation box 444.

The passivation layer deposition process will now be described. In this process reaction gas in the passivation layer formation box 444 is injected into the chamber lower part 10. The reaction gas passes through the gas injection pipe 80a, the backing plate 90, and the diffuser 70 via the gas piping 400, thereby forming the passivation layer 180. In this situation the RPS box 420 serves as a piping pathway. After forming the passivation layer 180 the insulating substrate is transported to the next fabrication apparatus. This process is repeated by forming a passivation layer on another insulating substrate 110, which may have data lines 171 formed thereon.

The second CVD apparatus is cleaned after about 12 to about 20 passivation layer deposition processes. The process forming the passivation layer 180 requires less number of cleaning processes as compared to the CVD apparatus forming the gate insulating layer 140. This is because the thickness of the film formed during the passivation formation process is less than that of the successive processes used in forming the gate insulating layer 140, the semiconductor layer 150, and the ohmic contact layer 160. Additionally, the inside of the second CVD apparatus may be cleaned using fluorine ($F_2$) prior to forming the passivation layer 180.

FIG. 10 illustrates a gas flow during the cleaning process of the second CVD apparatus using fluorine ($F_2$) plasma etching. Referring to FIG. 10, the passivation layer formation box 444 is closed while the fluorine ($F_2$) supplier 460 is open. In this configuration, the RPS box 420 forms plasma using fluorine ($F_2$) gas injected from the fluorine ($F_2$) supplier 460. Fluorine ($F_2$) plasma generated in the RPS box 420 is injected into the lower part 10 in order to remove the films deposited onto the inner walls of the lower part 10 and/or the surface of the diffuser 70.

On the other hand, as shown in FIGS. 1A and 1B, a transparent conductive layer may be formed on the insulating substrate 110 after the passivation layer 180 has been formed. This transparent conductive layer may be patterned to form the pixel electrodes 190, gate contact 95, and data contact 97.

In the manufacturing method of a TFT array panel according to the present invention, the inside of the CVD apparatus is cleaned prior to and/or after the various deposition processes. The cleaning may be done with fluorine ($F_2$), which is environmentally friendly and generated by the fluorine ($F_2$) generator, thereby minimizing pollution and decreasing manufacturing costs.

Additionally, unlike nitrogen trifluoride ($NF_3$), the conventional cleaning gas, which is purchased by the cylinder, the present invention utilizes fluorine ($F_2$) provided by the cylinder that is connected to the hydrofluoric (HF) electrolysis apparatus. Thus, the present invention can ensure the supply of cleaning gas.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method for forming a thin film transistor (TFT) array panel, comprising:
    providing a substrate;
    forming a plurality of gate lines on the substrate;
    successively forming a gate insulating layer on the plurality of gate lines, a semiconductor layer on the gate insulating layer, and an ohmic contact layer on the semiconductor layer in a first chemical vapor deposition (CVD) apparatus;
    generating a substantially pure fluorine gas, comprising:
        performing electrolysis in a fluorine generator to generate fluorine gas;
        filtering the fluorine gas by flowing the gas through a filter with a compressor, wherein the filtered gas is the substantially pure fluorine gas; and
        compressing the substantially pure fluorine gas into a fluorine cylinder;
    generating a fluorine plasma with the substantially pure fluorine gas in a remote plasma source (RPS) box connected to the first CVD apparatus; and
    cleaning the first CVD apparatus with the fluorine plasma after a predetermined number of the successive forming steps.

2. The method of claim 1, wherein the performing electrolysis comprises utilizing hydrofluoric acid received into the fluorine generator from a hydrofluoric acid container.

3. The method of claim 1, wherein forming a gate insulating layer further comprises:
    injecting reaction gas onto the insulating substrate arranged in the first CVD apparatus by flowing the reaction gas through a conduit, wherein the reaction gas is received from a gate insulating formation box.

4. The method of claim 3, wherein forming a gate insulating layer further comprises:
    flowing the reaction gas onto a diffusion plate for dispersing the reaction gas through a diffuser and onto the substrate.

5. The method of claim 1, wherein the predetermined number ranges between about 6 times and about 9 times.

6. The method of claim 1, wherein the predetermined number is 1 time, so as to clean the first CVD apparatus prior to each of the successive forming steps.

7. The method of claim 1, further comprising:
    forming a plurality of data lines;
    forming a passivation layer over the plurality of data lines and forming contact holes into the passivation layer in a second chemical vapor deposition (CVD) apparatus;
    cleaning the second (CVD) apparatus with a second fluorine plasma after a predetermined number of the forming passivation layer steps; and
    forming on the passivation layer a pixel electrode electrically connected to the second conductive layer.

8. The method of claim 7, wherein the predetermined number ranges between about 12 times and about 20 times.

9. The method of claim 7, wherein the predetermined number is 1 time, so as to clean the first CVD apparatus prior to each forming step of the passivation layer.

10. A method for forming a thin film transistor (TFT) array panel, comprising:
    providing an insulating substrate into a first chemical vapor deposition (CVD) apparatus;
    forming a first adhesion layer on the insulating substrate;
    forming a first conductive layer on the first adhesion layer;
    patterning the first adhesion layer and the conductive layer into a plurality of gate lines on the insulating substrate;
    successively forming a gate insulating layer on the plurality of gate lines, a semiconductor layer on the gate insulating layer, and an ohmic contact layer on the semiconductor layer in a first chemical vapor deposition (CVD) apparatus,
    wherein the first CVD apparatus is cleaned, prior to successively forming, with a first fluorine plasma generated in a remote plasma source (RPS) box;
    forming a second adhesion layer on the insulating substrate;
    forming a second conductive layer on the second adhesion layer;
    patterning the second adhesion layer and the second conductive layer into a plurality of data lines;
    forming a passivation layer over the plurality of data lines and forming contact holes into the passivation layer in a second CVD apparatus,
    wherein the second CVD apparatus is cleaned with a second fluorine plasma prior to forming the passivation layer; and
    forming pixel electrodes on the passivation layer and electrically connected to the second conductive layer,
    wherein the first fluorine plasma is generated with fluorine gas and generation of the fluorine gas comprises:
        electrodizing hydrofluoric acid to generate fluorine gas; and
        filtering the fluorine gas provided from the fluorine generator by transferring the gas through a filter, wherein the filtered gas is substantially pure fluorine gas.

11. The method of claim 10, wherein the generation of the fluorine gas further comprises compressing the fluorine gas into a fluorine cylinder.

* * * * *